United States Patent
Sheahan

(10) Patent No.: US 9,191,147 B1
(45) Date of Patent: Nov. 17, 2015

(54) APPARATUS AND METHOD FOR CONVERSION BETWEEN ANALOG AND DIGITAL DOMAINS WITH A TIME STAMP FOR DIGITAL CONTROL SYSTEM AND ULTRA LOW ERROR RATE COMMUNICATIONS CHANNEL

(76) Inventor: Benjamin J. Sheahan, Plano, TX (US)

( * ) Notice: Subject to any disclaimer, the term of this patent is extended or adjusted under 35 U.S.C. 154(b) by 0 days.

(21) Appl. No.: 13/200,075

(22) Filed: Sep. 16, 2011

Related U.S. Application Data

(60) Provisional application No. 61/403,480, filed on Sep. 16, 2010, provisional application No. 61/403,481, filed on Sep. 16, 2010, provisional application No. 61/403,482, filed on Sep. 16, 2010, provisional application No. 61/403,483, filed on Sep. 16, 2010.

(51) Int. Cl.
   *H04B 1/38* (2015.01)
   *H04L 5/16* (2006.01)
   *H04L 1/00* (2006.01)

(52) U.S. Cl.
   CPC .................................... *H04L 1/0001* (2013.01)

(58) Field of Classification Search
   CPC ................................ H03G 3/20; H04J 3/0664
   See application file for complete search history.

(56) References Cited

U.S. PATENT DOCUMENTS

| | | | | |
|---|---|---|---|---|
| 3,688,196 | A | * | 8/1972 | Doelz ........................... 375/261 |
| 5,430,485 | A | * | 7/1995 | Lankford et al. .......... 348/423.1 |
| 5,809,397 | A | * | 9/1998 | Harthcock et al. ........... 455/13.2 |
| 6,515,617 | B1 | * | 2/2003 | Demers et al. ........... 342/357.64 |
| 6,816,705 | B1 | * | 11/2004 | Quan et al. ................... 455/12.1 |
| 7,525,934 | B2 | * | 4/2009 | Ames et al. .................... 370/319 |
| 2003/0200038 | A1 | * | 10/2003 | Schweitzer et al. ............. 702/65 |
| 2006/0156375 | A1 | * | 7/2006 | Konetski ....................... 725/135 |
| 2007/0276670 | A1 | * | 11/2007 | Pearlstein ..................... 704/270 |

FOREIGN PATENT DOCUMENTS

WO   WO 2006123064 A1 * 11/2006

\* cited by examiner

*Primary Examiner* — Chieh M Fan
*Assistant Examiner* — Wednel Cadeau
(74) *Attorney, Agent, or Firm* — Mark A. Thomas

(57) ABSTRACT

An apparatus and method is disclosed with embodiments of a: 1. digital to analog and reference time converter; 2. analog and reference time to digital converter; 3. Sheahan non-linear time-varying, analog and digital control system; and 4. Sheahan Communication Channel are described in detail herein. Some embodiments use time stamp having 72 bits of time data sufficient to identify each clock pulse of a 9.192631770 GHz clock signal plus an additional 8 bits representing $2^8 = 256$ interpolated clock phases in order reach a resolution of approximately 0.425 picoseconds per clock phase. Thus an 80 bit time stamp is generated and used as described herein.

15 Claims, 6 Drawing Sheets

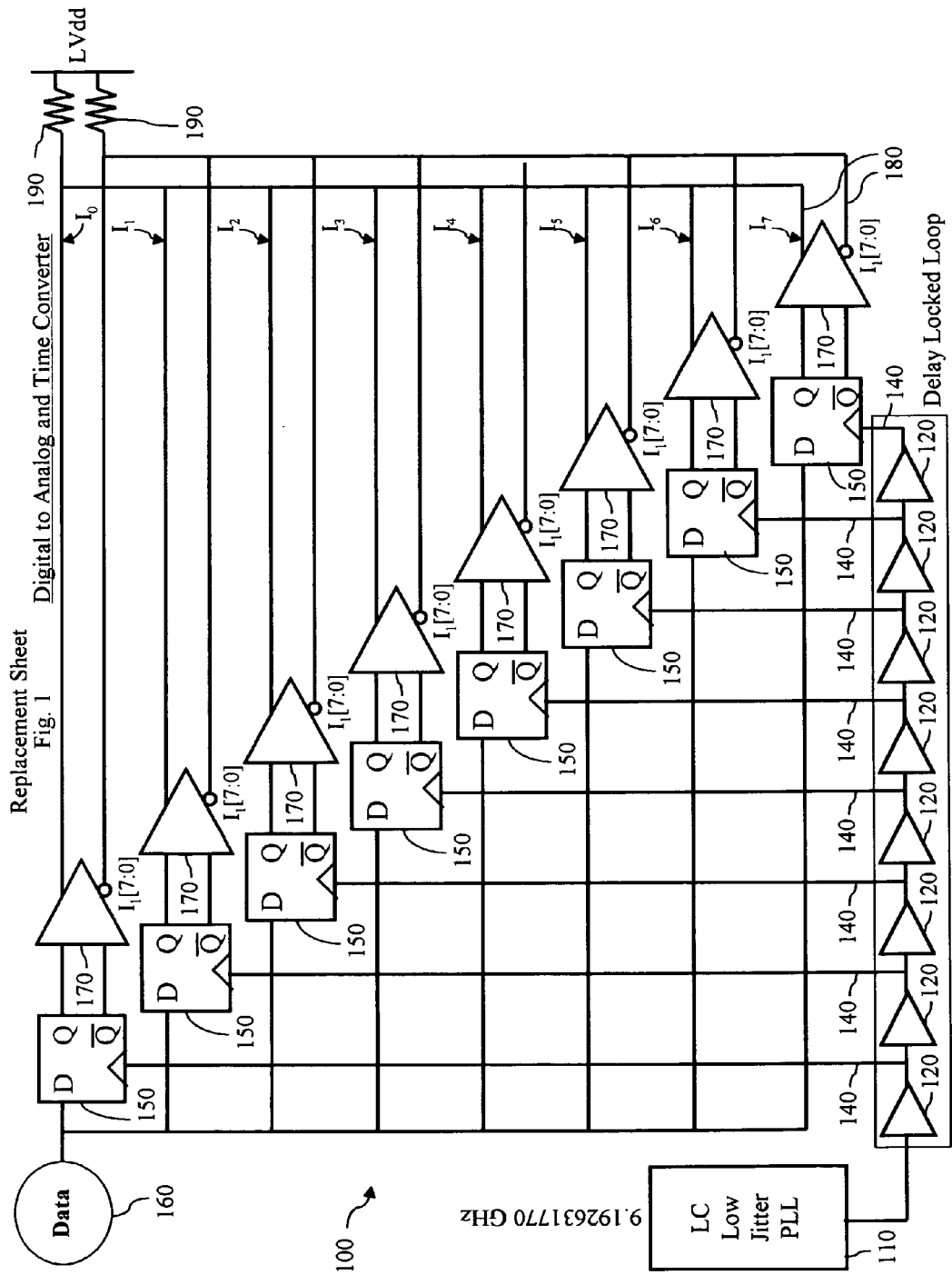
Replacement Sheet
Fig. 1

Analog and Time to Digital Converter

Single Comparator

Non Linear Time Varying Analog & Digital Control System

Sheahan Communication Channel

Sheahan Ultra Low Error Rate Communication Channel

Simulation Results

APPARATUS AND METHOD FOR CONVERSION BETWEEN ANALOG AND DIGITAL DOMAINS WITH A TIME STAMP FOR DIGITAL CONTROL SYSTEM AND ULTRA LOW ERROR RATE COMMUNICATIONS CHANNEL

CROSS-REFERENCE TO RELATED APPLICATION(S)

This application claims the benefit of U.S. Provisional Patent Application No. 61/403,480, filed Sep. 16, 2010, U.S. Provisional Patent Application No. 61/403,481, filed Sep. 16, 2010, U.S. Provisional Patent Application No. 61/403,482, filed Sep. 16, 2010, and U.S. Provisional Patent Application No. 61/403,483, filed Sep. 16, 2010.

FIELD OF INVENTION

The present invention relates to an apparatus and method of improved telecommunications, more specifically, a high-resolution absolute reference time stamp is used to provide an enhanced conversion between analog and digital signal domains to implement an ultra-low error rate communication channel as part of a linear, time varying and adaptive analog and digital control system.

BACKGROUND

It has been widely observed that the volume of communications between primarily digital devices continues to expand over time, putting ever increasing demands on both wired and wireless communications bandwidth. For example, a great variety of devices including wireless mobile telephones, computers wirelessly connected to the Internet, disk drives, etc. require increased bandwidth to adequately perform their functions.

The capabilities of such digital devices has arguably been increased along with their utilization of communications bandwidth, however, many of these digital devices employ wired or wireless communication signals that are in analog form or are impacted by the communications environment by analog-type effects such noise, interference and other forms of signal degradation. Finding improved methods of communications has been an imperative in the engineering community for many years. Correspondingly, a large variety of sophisticated communication schemes have been developed to mitigate the deleterious effects mentioned above and communications bandwidth has been greatly improved. Unfortunately, many of these approaches are nearing the theoretical maximum efficiency for the strategies they employ, yet additional communications bandwidth is still sought. Therefore, it would be desirable to develop an improved approach to significantly further improve communications bandwidth and mitigate some or all of the concerns referred to herein.

SUMMARY

Current limitations in current communications schemes converting between analog and digital signals are overcome by the present invention that further includes a reference time stamp. The reference time stamp is a defined absolute time reference.

These general and specific aspects may be implemented using a digital hardware, corresponding software or a combination of hardware and software. Other features will be apparent from the description, drawings and claims.

DRAWINGS

Drawing Figures

FIG. 1 is a block diagram of a digital to analog and time converter of the present invention;

DETAILED DESCRIPTION

Figure 2:
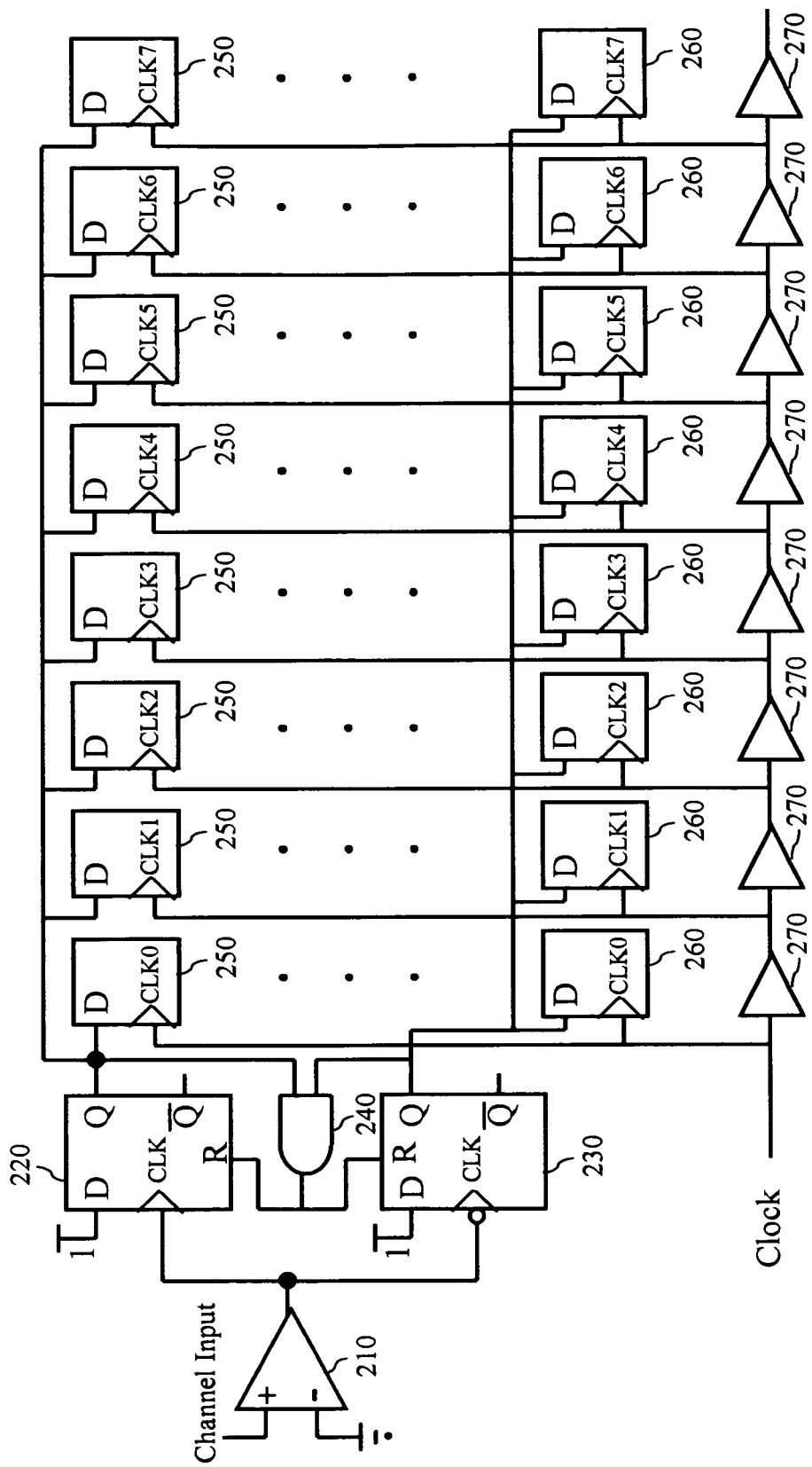
FIG. 2 is a block diagram of an analog and time to digital converter of the present invention.

Embodiments of a: 1. digital to analog and time converter; 2. analog and time to digital converter; 3. Sheahan non-linear time-varying, analog and digital control system; and 4. Sheahan Communication Channel are described in detail herein.

Some embodiments employ a defined absolute reference time stamp for conversion between the digital and analog realms in accordance with the present invention to enable a novel and greatly improved approach to significantly reduce communication error and improve communications bandwidth. The time stamp of the present invention is based on a defined starting point, in some embodiments, the first year of the Julian calendar, and includes a sufficient number of clock bits to cover an approximately 14,000 year time span, thereby making the system robust even over extreme lengths of time. The time stamp is incremented based on atomic clocking principles using the hyperfine transition of electron energy levels of cesium 133 atoms at approximately 9.192631770 GHz. The cesium oscillator can be used as a counter and can be aligned to the reference clock maintained by the National Institute of Standards and Technology (NIST) in Boulder, Colo. Although the time keeping standard based on cesium atomic resonance is used herein, the present invention is not limited to any particular timekeeping standard and the cesium standard was chosen for convenience.

Because the time stamps used by embodiments of the present invention cover both a large range of time and do so at very high precision, 72 bits are used in one preferred embodiment plus an additional 8 bits representing $2^8=256$ interpolated clock phases in order reach a resolution of approximately 0.425 picoseconds per clock phase. Thus an 80 bit time stamp is generated and used as described herein.

In FIG. 1, there is shown a block diagram of a digital to analog and time converter 100 of the present invention. In this diagram a digital input is used to create an analog output for transmission with a defined absolute reference time stamp. An LC (inductance-capacitance) controlled Low Jitter Phase Lock Loop (PLL) 110 running at 9.192631770 GHz is used to generate clock pulses. The clock pulses from the PLL 110 are driven to a series of delay buffers 120 or similar elements to form a Delay Locked Loop (DLL) 130. Eight phase-shifted clock pulses 140 are generated by the DLL 130 and driven to eight D-type flip-flops 150. Digital data 160 received by the digital to analog and time converter 100 for transmission is first received by the D-input nodes of the eight D-type flip-flops 150. Clocking of the eight D-type flip-flops 150 by the eight phase-shifted clock pulses 140 correspondingly causes the digital data to be stored and output by the eight D-type flip-flops 150. Output from the eight D-type flip-flops 150 is received by eight digital to current converters 170 that output an analog signal. The digital to current converters 170 each represent a different current range, approximately half that of the digital to current converters 170 shown above and to the left for seven of the eight digital to current converters 170. Current output from the digital to current converters 170 is combined into a differential output analog pair 180. The differential output analog pair 180 is connected to low voltage LVdd, which in some embodiments is 5 volts, through a pair of resistors 190.

Digital data 160 received by the digital to analog and time converter 100 is converted to analog form on the differential output analog pair 180 for transmission to an intended receiver. Each data byte is output when the local time reference is equal to the associated time stamp. The time stamp information is transmitted along with the analog output encoded in slight adjustments in the timing (Phase Modulation) in the output transitions.

Turning to FIG. 2, there is shown a block diagram of an analog and time to digital converter 200 of the present invention. An analog signal from a potentially noisy channel is received by a differential comparator 210 on the comparator's 210 positive input. As shown here, a negative input of the comparator 210 is grounded. In some alternative embodiments the positive input of the comparator 210 receives a positive portion of a signal originating from the differential output analog pair 180 in FIG. 1 and the negative input of the comparator 210 receives a negative portion of a signal originating from the differential output analog pair 180 in FIG. 1. In either case, the comparator 210 output is driven as a clock signal to a positive edge-detecting D-type flip flop 220 connected in parallel with a negative edge-detecting D-type flip flop 230 effectively clocked on opposite edges. Both edge-detecting flip flops 220, 230 have their D inputs connected to a voltage representing a logical "1" and their Q outputs connected to a resetting AND gate 240.

When the resetting AND gate 240 receives a logical "1" from both of the edge-detecting D-type flip flops 220, 230 a logical "1" is generated on the output of the resetting AND gate 240 and is transmitted to the reset inputs of the edge-detecting D-type flip flops 220, 230 in order to reset them. In this fashion, both positive and negative edges are detected by the edge-detecting D-type flip flops 220, 230. The Q output from the positive edge-detecting D-type flip flop 220 is driven to a series of positive edge counter D-type flip flops 250. Correspondingly, the Q output from the negative edge-detecting D-type flip flops 230 is driven to a series of negative edge counter D-type flip flops 260. A delay locked loop 270, similar to the delay locked loop 120 in FIG. 1, is used to clock both the series of positive edge counter D-type flip flops 250 and the series of negative edge counter D-type flip flops 260. More specifically, a 72 Bit Time Stamp counter is running and 8 bits of fine time information is encoded from the delay locked loop 270 phases.

The analog and time to digital converter 200 converts an incoming bit stream into corresponding logical "0" and "1" signals. As shown in FIG. 2, an array of Comparators 210, D-type flip flops 220 230, AND gate 240 and edge counter D-type flip flops 250, 260 are also envisioned to fit a desired application.

Figure 3:
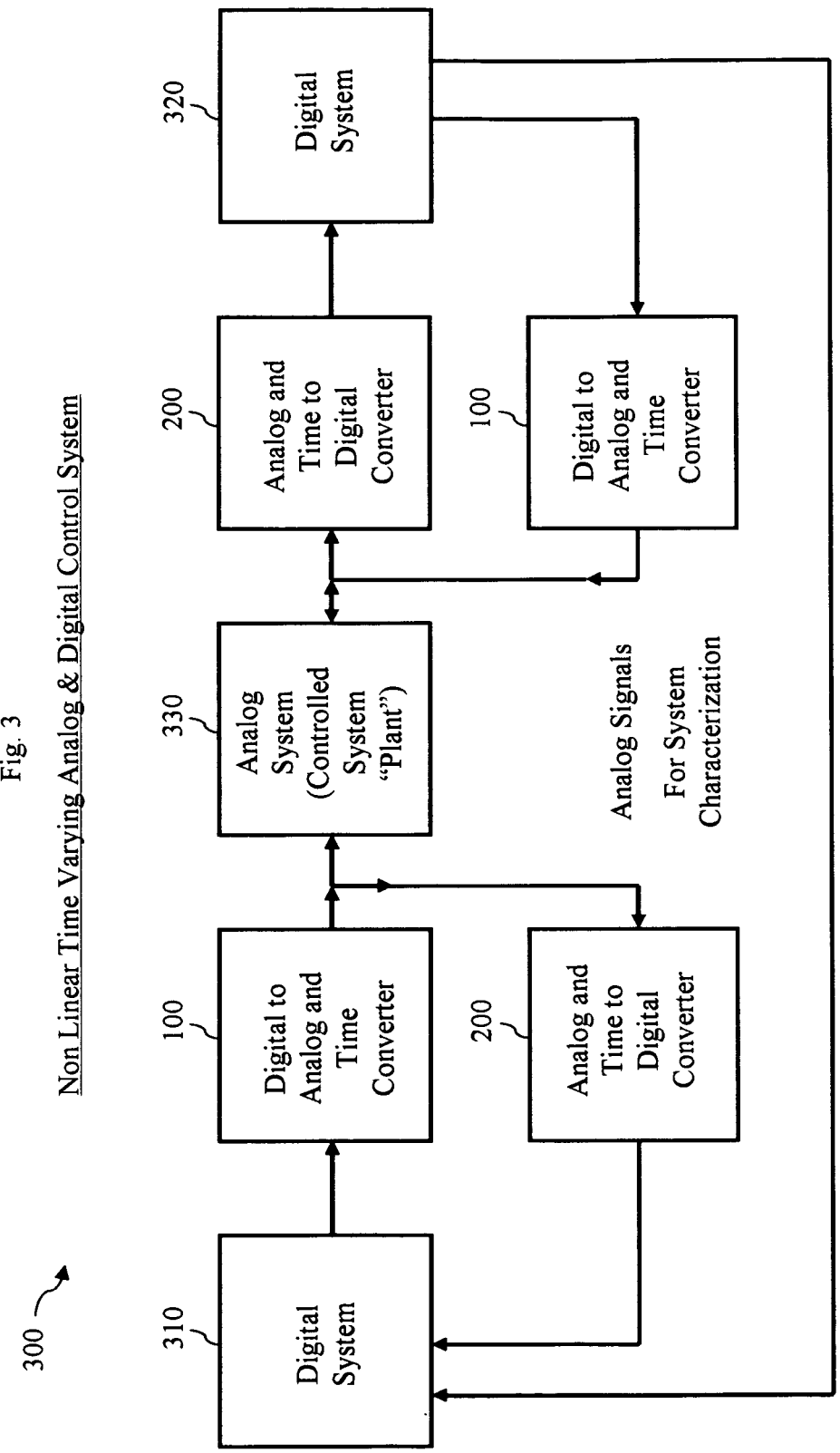
FIG. 3 is a block diagram of Sheahan non-linear time-varying, analog and digital control system of the present invention.

In FIG. 3 there is shown a block diagram of a Sheahan non-linear time-varying, analog and digital control system 300 of the present invention. The Sheahan control system 300 communicatively couples a first digital system 310 and a second digital system 320. Digital signals transmitted from the first digital system 310 are converted by a first digital to analog and time converter 100 into analog signals and a time stamp, as described above, and transmitted to an analog system 330. The analog system 330 can employ wireless or wired communications. Analog signals and the time stamp from the analog system 330 are received by a first analog and time to digital converter 200 and converted into digital signals, as described above. The digital signals from the first analog and time to digital converter 200 are transmitted to the second digital system 320.

In order to allow for bidirectional communications in the Sheahan non-linear time-varying, analog and digital control system 300, the second digital system 320 is also connected to a second digital to analog and time converter 100. The second digital to analog and time converter 100 transmits analog signals and a time stamp through the analog system 330 to a second analog and time to a second analog and time to digital converter 200. The second analog and time to digital converter 200 converts the analog signals to digital signals and transmits the digital signals to the first digital system 310.

When time stamp and amplitude information, encoded in the phase modulation, is encoded in the transmitted signals through the control system or communication system, then time varying and non-linear noise and other signal impairments can be corrected and the operation of the control or communication system is dramatically improved.

Figure 4:
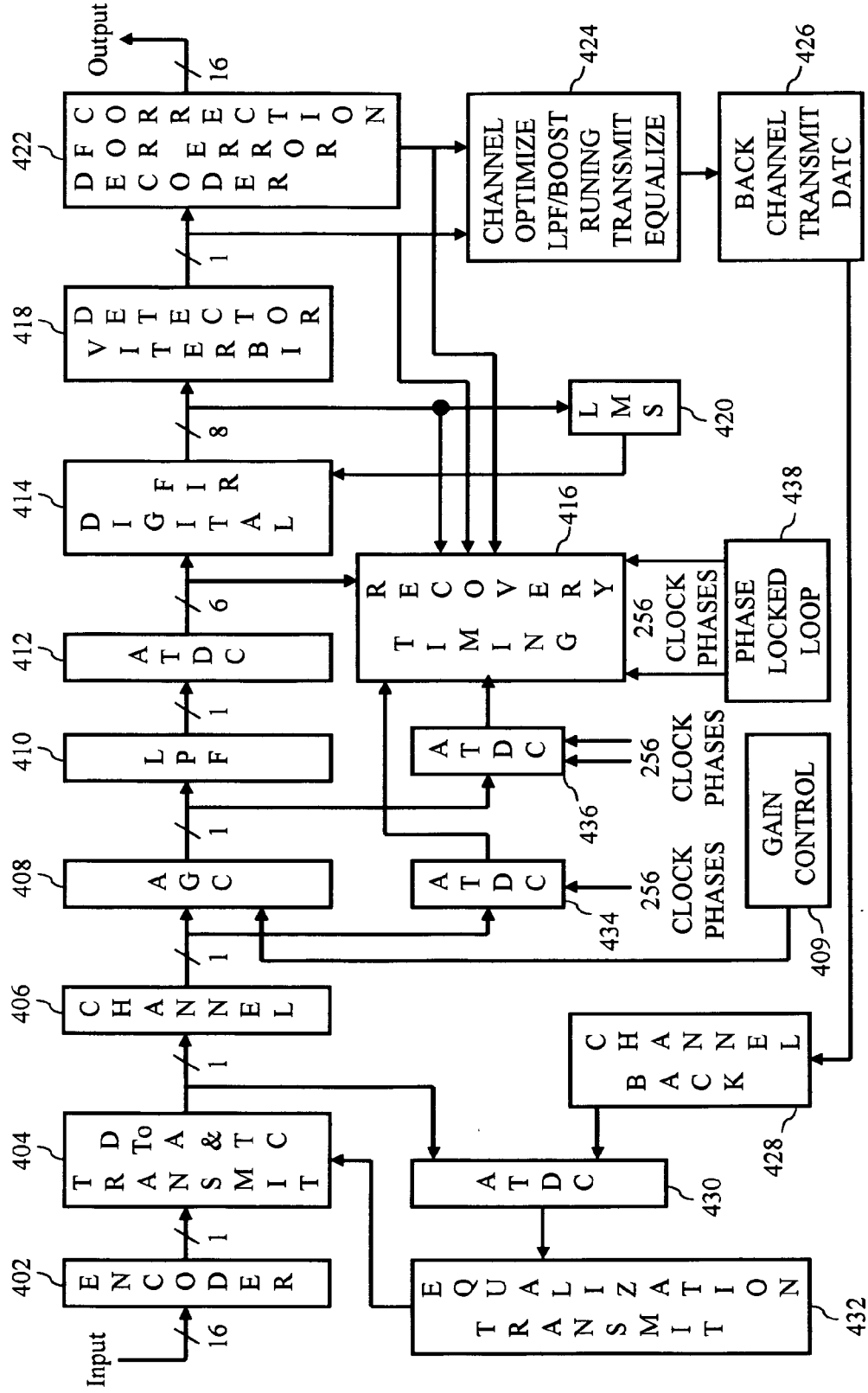
FIG. 4 is a block diagram of Sheahan Communication Channel of the present invention.

Turning to FIG. 4 there is shown a block diagram of Sheahan Communication Channel 400 of the present invention. The Sheahan Communication Channel 400 is highly adaptable and functions in a wide variety of wired and wireless communications environments. The Sheahan Communication Channel 400 uses an encoder 402 that receives 16 digital bits in parallel for encoding. The encoder 402 encodes the 16 bits into a 1 bit data stream driven to a transmit digital to analog and time converter 404 of the type described herein. The transmit digital to analog and time converter 404 converts the digital data stream from the transmit encoder 402 into an analog signal and associated time stamp for transmission through a channel 406. The channel 406 can be wired, for example a disk drive, or wireless, etc. and is not limited to any particular method or medium. The signal is received by an automatic gain control (AGC) module 408 that controls the amplitude of the received signals. Note that in an alternative embodiment, an analog and time to digital converter may be placed between the channel 406 and the AGC module 408 to facilitate the filtering of extreme noise events. The AGC module 408 also receives input from a gain control module 409 as shown.

As shown in FIG. 4, the AGC module 408 outputs an analog signal with a minimum and maximum within the linear or normal operating range of a low pass filter (LPF) 410. The LPF 410 filters out high-frequency noise and passes the analog signal to an analog and time to digital converter 412. The analog and time to digital converter 412 functions as described herein and drives a six bit output to a digital finite input response (FIR) module 414 and a timing recovery module 416. The digital FIR module 414 transmits an 8 bit data stream to a Viterbi detector 418. The digital FIR module 414 also transmits the 8 bit data stream to the timing recovery module 416 and a Least Mean Squares (LMS) module 420 for error detection, an indication of which is received from the LMS module 420. The purpose of the LMS module 420 is to detect and decrease the probability of errors remaining in the system. One use of the LMS module 420 is to account for variations in disk head height as it "flies" above a moving disk. Note that in some embodiments the LMS module 420 is not necessary and/or eliminated because the level of errors is sufficiently low that the advantages of eliminating the LMS module 420 outweigh the disadvantages.

The Viterbi detector 418 transmits a one bit data stream to a decoder for error correction 422. The decoder for error correction 422 uses "off the self" components to decode and perform error correction and produces a 16 bit output. Both the Viterbi detector 418 and the decoder for error correction 422 also transmit their output signals to the timing recovery module 416.

In addition to the primary communications channel just described in FIG. 4, the Sheahan Communication Channel 400 also provides for a back channel. The back channel can be used (and is not limited to) remove or decrease the impact of multipath distortion such as that due to reflections, frequency errors, phase noise and timing jitter to improve the operation of severely impaired channels due to bandwidth limitations or attenuation. Data output from the Viterbi detector 418 and data from the decoder for error correction 422 are received by a channel optimize LDP/boost tuning transmit equalizer 424. Output from the equalizer 424 is driven to a back channel transmit digital to analog and time converter 426. The back channel converter 426 converts the digital data received into analog data and a time stamp for transmission back through a back channel 428. Note that the back channel 428 may be part of the channel 406 or it may be separate. Signals passed through the back channel 428 are received by an analog and time to digital converter 430. The analog and time to digital converter 430 converts the analog signals and time stamp back into digital form and transmits the digital data to a transit equalization module 432. The transit equalization module 432 receives the digital data from the analog and time to digital converter 430, performs an equalization function and transmits the digital data to the transmit digital to analog and time converter 404.

The timing recovery module 416, in addition to the connectivity described above, receives data from the channel 406 after it has been converted into digital form by an analog and time to digital converter 434. The timing recovery module 416 also receives data from the AGC 408 after it has been converted into digital form by an analog and time to digital converter 436. The timing recovery module 416 is used to recover a past preamble or timing synchronization. One example of this function is that it is used in disk drives to recover the correct clock phase. A phase locked loop 438 is used to generate 256 interpolated clock phases as described herein. The clock phases are driven on 256 lines to the timing recovery module 416 as well as all analog and time to digital converters 412, 430, 434, 436. While 64 clock phases can be used in some embodiments, 256 clock phases provide additional resolution to the system into timing recovery unit.

Figure 5:
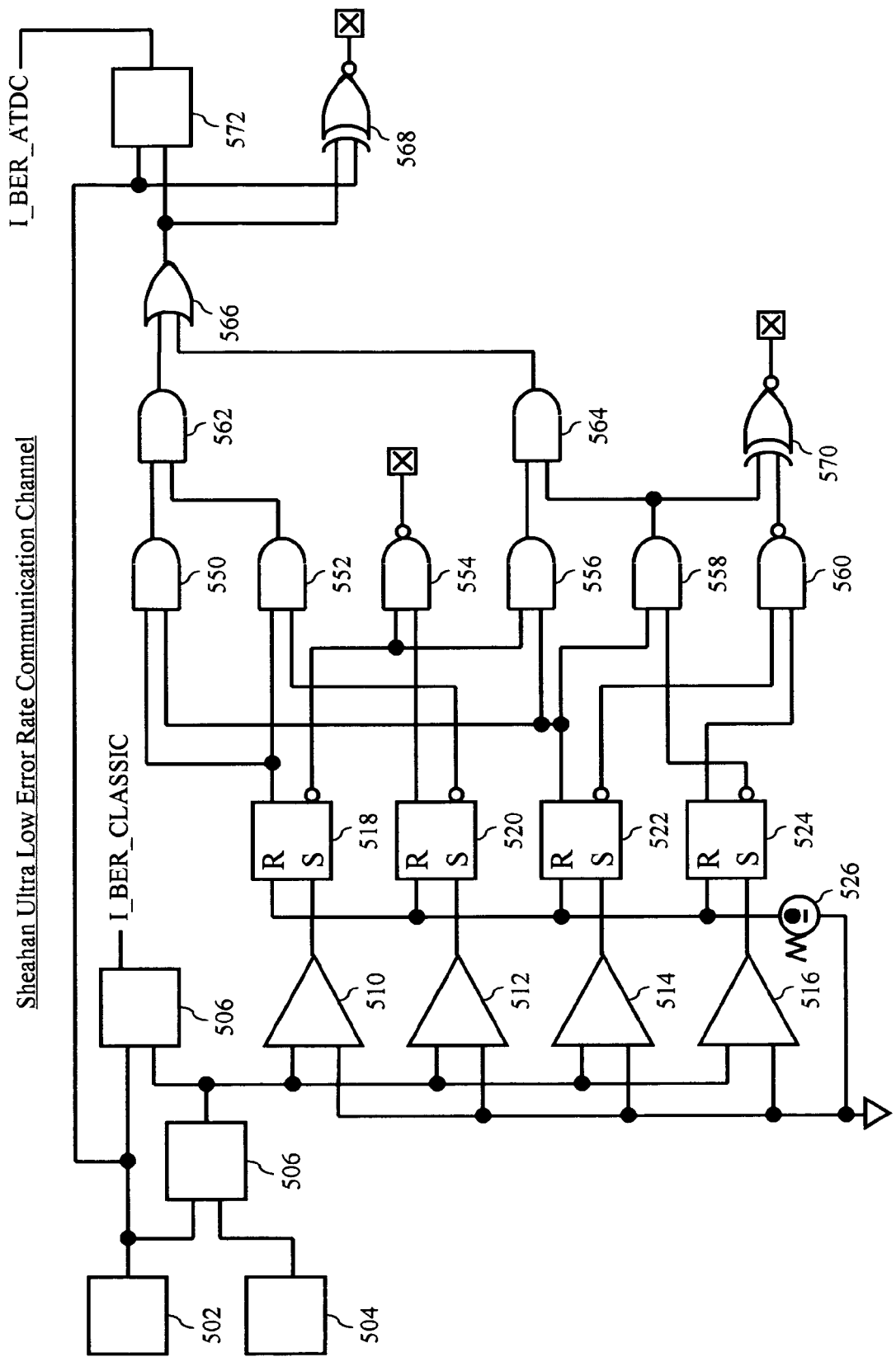
FIG. 5 is a block diagram of Sheahan Ultra-Low Error rate (ULE) receiver of the present invention.
Figure 6:
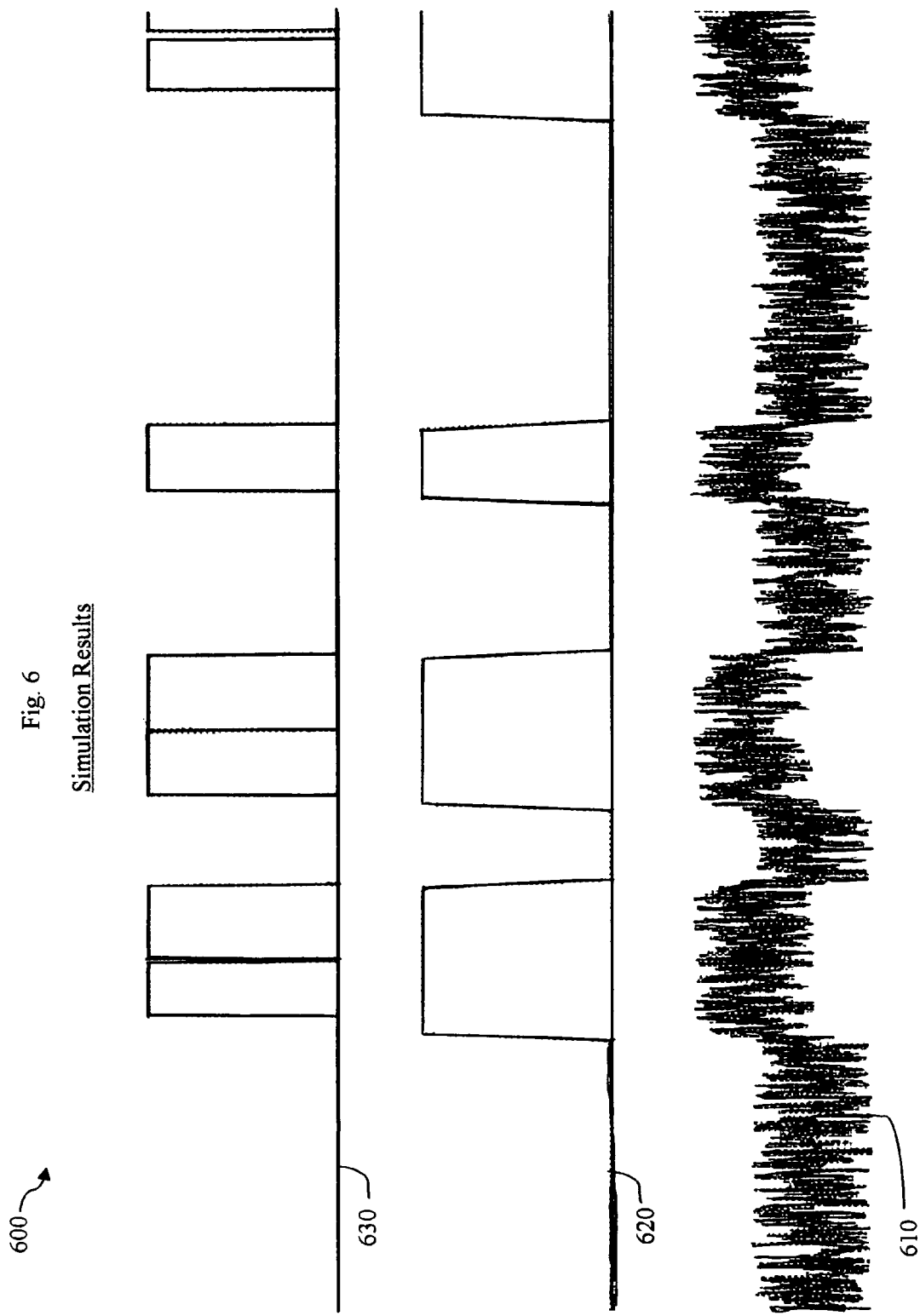
FIG. 6 is a simulation of the Sheahan ULE receiver of the present invention.

In FIG. 5 there is shown a block diagram of a Sheahan Ultra-Low Error rate (ULE) receiver 500 of the present invention. The Sheahan Ultra-Low Error rate (ULE) receiver 500 is shown with some components for simulation as depicted in FIG. 6, more specifically, a digital random Bit Sequence (or Random Data) generator (RNG) 502 having a pseudo-random Bit Generator function and outputting bits at 10 GHz. An analog random noise generator (RNG) 504 is also shown. Output from Random Bit Generator 502 simulates the data transmitted and Output from the Random Noise Generator 504 simulates noise in a real environment and both are driven to a Sum module 506 that combines the signal as shown to produce a "noisy" channel for purposes of this simulation. The noisy channel is received by a Slicer 508 that includes an error counter and produces the I_BER_CLASSIC which is a count of the classical bit error rate (BER).

The noisy channel from the SUM module 506 is received by four differential comparators 510, 512, 514, 516 as shown. In this example, following voltage limits are used, but others can be used tailored to the environment the invention is used in. The voltage limit for triggering comparator 510 is set to 1.97 volts. The voltage limit for triggering comparator 512 is set to −0.97 volts. The voltage limit for triggering comparator 514 is set to 1.90 volts. The voltage limit for triggering comparator 516 is set to −0.90 volts. Output signals from the comparators 510, 512, 514, 516 are driven to the S inputs in four RS flip-flops 518, 520, 522, 524 as shown. The R inputs in the four RS flip-flops 518, 520, 522, 524 receive a clock pulses from a clock 526 running at 1 GHz for simulation purposes, but preferably running at 9.192631770 GHz, as described herein with regard to the time stamp. The signals from the four RS flip-flops 518, 520, 522, 524 are combined by AND gates 440, 552, 554, 556, 558, 560, 562, 564, OR gate 566, and exclusive or (XOR or EX-OR) gates 568, 570 as shown. An error counter 572 produces the signal I_BER_ATDC corresponding to the bit error rate of the analog and time to digital converter. The signal output from the EX-OR gate 566 indicates errors when this signal is a logical 1. When this signal is 0 then there are no errors. The signal output from the XOR 568 is the error signal. The Sheahan Ultra-Low Error rate (ULE) receiver 500 is simulated in FIG. 6 to demonstrate its significant performance advantages.

Turning to FIG. 6 there is shown a simulation 600 of the Sheahan ULE receiver 500 of the present invention. A noisy channel 610, corresponding to the output the Sum module 506 in FIG. 5 is shown. This channel is experiencing a high level of noise as shown. The differential voltage thresholds described in FIG. 5 are set to detect large excursions from a 1 volt, noise-free input signal 620. The use of paired differential comparators 510, 512 and paired differential comparators 514, 516 enable highly reliable detection of the underlying digital signal as shown in recovered waveform 630. As can be seen in recovered waveform 630 there is a delay between the ideal noise-free input signal 620 and the recovered waveform 630. The reason is that the underlying noise was not sufficient to trigger the differential comparators 510, 514 until that point in time as can be seen by close examination of the noisy channel 610. In this fashion, noise becomes an asset in detecting the underlying signal 620.

It is understood that the embodiments described within this application achieve significant communication bandwidth improvements and reduction of error through the uses of a reference time stamp instead of the use of relative clock periods. Fundamentally, knowing time to some reference allows additional error correction and channel improvement over that of tradition translation between the analog and digital domains which implicitly use relative time though clock pulses. The time stamp provides additional information that is used to improve the received and transmitted signal in both the Analog and Digital domains and in both the amplitude and timing portions of the signal.

It is understood that the forms of the invention shown and described in the detailed description and the drawings are to be taken merely as examples. It is intended that the following claims be interpreted broadly to embrace all the variations of the example embodiments disclosed herein. Thus the scope of the invention should be determined by the appended claims and their legal equivalents, rather than by the examples given.

What is claimed is:

1. A method for communicating digital data, comprising the steps of:

converting the digital data to analog data at an absolute reference time;

generating a defined absolute reference time stamp representing the absolute reference time for each bit of converted digital data;

transmitting the analog data and the defined absolute reference time stamp;

receiving the analog data and the defined absolute reference time stamp;

correcting erroneous signals in the analog data with the defined absolute reference time stamp to improve a bit error rate impacted by at least one of multipath distortion, frequency error, phase noise, timing jitter, timing synchronization error and recovered clock phase error; and converting the analog data to digital data.

2. The method for communicating digital data of claim 1, wherein the step of transmitting the analog data and the defined absolute reference time stamp is performed wirelessly.

3. The method for communicating digital data of claim 1, wherein the step of transmitting the analog data and the defined absolute reference time stamp is performed via wired connections.

4. The method for communicating digital data of claim 1, wherein the defined absolute reference time stamp is 80 bits.

5. The method for communicating digital data of claim 1, wherein the step of generating a defined absolute reference time stamp uses a clock signal running in excess of 9.1 GHz.

6. A method for transmitting digital data, comprising the steps of:

converting the digital data to analog data at an absolute reference time;

generating a defined absolute reference time stamp representing the absolute reference time for each bit of converted digital data; and transmitting the analog data and the defined absolute reference time stamp to improve a bit error rate impacted by at least one of multipath distortion, frequency error, phase noise, timing jitter, timing synchronization error and recovered clock phase error.

7. The method for communicating digital data of claim 6, wherein the step of transmitting the analog data and the defined absolute reference time stamp is performed wirelessly.

8. The method for communicating digital data of claim 6, wherein the step of transmitting the analog data and the defined absolute reference time stamp is performed via wired connections.

9. The method for communicating digital data of claim 6, wherein the defined absolute reference time stamp is 80 bits.

10. The method for communicating digital data of claim 6, wherein the step of generating a defined absolute reference time stamp uses a clock signal running in excess of 9.1 GHz.

11. A communications apparatus, comprising:

a receiver, the receiver for receiving analog data converted from digital data at an absolute reference time, and a defined absolute reference time stamp, the defined absolute reference time stamp representing the absolute reference time for each bit of converted digital data prior to receipt of the analog data and the defined absolute reference time stamp by the receiver;

an error corrector, the error corrector for correcting erroneous signals in the analog data with the defined absolute reference time stamp to improve a bit error rate impacted by at least one of multipath distortion, frequency error, phase noise, timing jitter, timing synchronization error and recovered clock phase error; and a converter, the converter converting the analog data to digital data.

12. The communications apparatus of claim 11, wherein the receiver receives the analog data and the defined absolute reference time stamp wirelessly.

13. The communications apparatus of claim 11, wherein the receiver receives the analog data and the defined absolute reference time stamp via wired connections.

14. The communications apparatus of claim 11, wherein the defined absolute reference time stamp is 80 bits.

15. The communications apparatus of claim 11, wherein the defined absolute reference time stamp is based on a clock signal running in excess of 9 GHz.

\* \* \* \* \*